(12) United States Patent
Hwang

(10) Patent No.: US 7,391,098 B2
(45) Date of Patent: Jun. 24, 2008

(54) SEMICONDUCTOR SUBSTRATE, SEMICONDUCTOR DEVICE AND METHOD OF MANUFACTURING THE SAME

(75) Inventor: Chul Ju Hwang, Gyeonggi-Do (KR)

(73) Assignee: Jusung Engineering Co., Ltd., Gwangju-si (KR)

( * ) Notice: Subject to any disclaimer, the term of this patent is extended or adjusted under 35 U.S.C. 154(b) by 141 days.

(21) Appl. No.: 11/297,504

(22) Filed: Dec. 7, 2005

(65) Prior Publication Data

US 2006/0118915 A1 Jun. 8, 2006

(30) Foreign Application Priority Data

Dec. 7, 2004 (KR) .................. 10-2004-0102282

(51) Int. Cl.
*H01L 29/12* (2006.01)
(52) U.S. Cl. ................. 257/616; 438/282; 257/E21.093
(58) Field of Classification Search ................. 438/282; 257/616, E29.082, E21.093, E21.103
See application file for complete search history.

(56) References Cited

U.S. PATENT DOCUMENTS

| | | | |
|---|---|---|---|
| 5,019,882 A * | 5/1991 | Solomon et al. ............. | 257/409 |
| 6,455,330 B1 * | 9/2002 | Yao et al. ....................... | 438/3 |
| 6,607,948 B1 * | 8/2003 | Sugiyama et al. ............ | 438/151 |
| 6,723,621 B1 * | 4/2004 | Cardone et al. .............. | 438/478 |
| 2005/0098234 A1 * | 5/2005 | Nakaharai et al. ........... | 148/33.3 |
| 2005/0285097 A1 * | 12/2005 | Shang et al. .................. | 257/19 |

FOREIGN PATENT DOCUMENTS

WO    WO 00/54338    9/2000

OTHER PUBLICATIONS

U.S. Appl. No. 60/124,299, filed Mar. 12, 1999, Chu.

* cited by examiner

*Primary Examiner*—Trung Dang
(74) *Attorney, Agent, or Firm*—Marger Johnson & McCollom PC

(57) ABSTRACT

The present invention relates to a semiconductor substrate, a semiconductor device with high carrier mobility and a method of manufacturing the same. According to the present invention, there are provided a semiconductor substrate comprising a silicon substrate, a single crystal germanium layer formed on the silicon substrate, and a silicon layer formed on the single crystal germanium layer; a semiconductor device comprising a gate electrode formed on the semiconductor substrate, and junctions formed in the substrate at both sides of the gate electrode; and a method of manufacturing the semiconductor device. Therefore, carrier mobility of channels can be enhanced since the channels of semiconductor devices are placed within the germanium layer. Further, since the silicon layer is formed on the germanium layer, the reliable gate insulation film can be formed and a leakage current produced in a junction layer can also be reduced. Moreover, the same effect can be obtained without using an expensive germanium wafer. Accordingly, since conventional processes and equipment can be used as they are, highly efficient semiconductor devices can be fabricated without increase of a unit cost of production.

10 Claims, 4 Drawing Sheets

SEMICONDUCTOR SUBSTRATE, SEMICONDUCTOR DEVICE AND METHOD OF MANUFACTURING THE SAME

BACKGROUND OF THE INVENTION

This application claims the priority of Korean Patent Application No. 10-2004-0102282, filed on Dec. 7, 2004, in the Korean Intellectual Property Office, the disclosure of which is incorporated herein in its entirety by reference.

1. Field of the Invention

The present invention relates to a semiconductor substrate, a semiconductor device with high carrier mobility and a method of manufacturing the same.

2. Description of the Related Art

With the development of a process of manufacturing semiconductor devices, the degree of integration of semiconductor devices is improved, so that a channel length of a metal oxide semiconductor field effect transistor (hereinafter, referred to as "MOSFET") has recently been reduced to 50 nm or less.

In a case where a channel length is shortened extremely in this manner, i.e. as a channel length shown in device scaling becomes shorter, a phenomenon that a drain current is increased is remarkably slowed down and the drain current cannot be further increased. The increase in a drain current directly leads to the increase of an operating speed of devices. It means that the improvement of the operating speed of deices cannot be achieved as high as desired only by a method of simply reducing the channel length.

To solve such a problem, studies on MOSFET devices with high mobility have been actively conducted.

First, as for high-performance MOSFETs with high mobility, a technique for increasing carrier mobility of devices by forming a MOSFET on a strained silicon substrate has been employed.

To this end, the MOSFETs have been manufactured using a special wafer on which a silicon substrate, a SiGe buffer layer, a SiGe layer and a strained silicon layer are sequentially formed. This provides a strain effect to the silicon layer using a difference between lattice structures of germanium and silicon. In other words, this is a technique for manufacturing a device such that a top strained silicon layer becomes a channel region, using a phenomenon that mobility is enhanced due to a reduced phonon distribution in a case where electrons or holes move in a strained silicon layer.

However, in a case where the MOSFET device is manufactured through the aforementioned technique, a great quantity of silicon crystal defects exists even in the top strained silicon layer due to a crystal lattice mismatch caused by a thick SiGe layer. At this time, there is a problem in that since the quantity of the silicon crystal defects is at least over $10^4/cm^2$, yield is decreased when manufacturing high integrated circuits. Further, there is another problem in that the maximum carrier mobility of the MOSFET is difficult to exceed 60%.

Next, there is another technique for applying strains only to silicon in channel regions by means of various methods after MOSFET devices have been manufactured.

According to this technique, the MOSFET has been first manufactured. Then, strains are applied to channel regions using a method of etching only source/drain regions and then selectively growing SiGe at the etched regions to apply mechanical stresses to the channel regions, or a method of forming a silicon nitride layer on the MOSFET to apply mechanical stresses to the formed silicon nitride layer.

However, there is a disadvantage in that the device manufacturing process is complicated since different kinds of strain techniques should be applied to MOSFET and PMOSFET devices, respectively, according to the aforementioned technique. Further, there is a problem in that the maximum carrier mobility of the MOSFET is difficult to exceed 60%. Furthermore, since the degree of mobility improvement varies considerably according to channel lengths, it is very difficult to extract a transistor model parameter for integrated circuit design.

Finally, there is a further technique for manufacturing Ge MOSFETs using a germanium substrate.

In this technique, since the mobility of electrons and holes is 2 to 6 times greater in a germanium substrate than in a silicon substrate, the MOSFET has been manufactured by using the germanium substrate instead of the silicon substrate, in order to increase the carrier mobility.

However, there is a problem in that the reliability of devices is reduced because it is difficult to form reliable gate dielectric layers on the germanium substrate. Further, there is a disadvantage in that since a band gap of germanium is approximately a half less than that of silicon, a junction leakage current is increased in a case where the source/drain is formed on the germanium substrate. Furthermore, there is another problem in that a silicon wafer cannot be replaced with a germanium wafer in view of a mass-production level since the production costs of the germanium wafer is five times higher than those of the silicon wafer and the germanium element is rarer than the silicon element.

SUMMARY OF THE INVENTION

The present invention is conceived to solve the aforementioned problems in the prior art. Accordingly, an object of the present invention is to provide a semiconductor device capable of exhibiting high carrier mobility, solving the problems of crystal defects and unstable formation of gate insulation films on a germanium substrate and preventing the generation of a leakage current by using a substrate a substrate on which germanium and silicon layers are sequentially formed, and a method of manufacturing the same.

According to an aspect of the present invention, there is provided a semiconductor substrate, comprising: a silicon substrate; a single crystal germanium layer formed on the silicon substrate; and a silicon layer formed on the single crystal germanium layer.

Preferably, the single crystal germanium layer is formed to such a thickness that a lattice defect is not generated between the single crystal germanium layer and the silicon substrate. That is, the single crystal germanium layer is preferably formed to a thickness of 0.01 to 15 nm. Further, the silicon layer is preferably formed to a thickness of 1 to 3 nm.

According to another aspect of the present invention, there is provided a semiconductor device, comprising: a gate electrode formed on a semiconductor substrate, which includes a silicon substrate, a single crystal germanium layer formed on the silicon substrate, and the silicon layer formed on the single crystal germanium layer; and junctions formed in the substrate at both sides of the gate electrode.

According to a further aspect of the present invention, there is provided a method of manufacturing a semiconductor device, comprising the steps of: (a) forming a single crystal germanium layer on a silicon substrate; (b) forming a silicon layer on the single crystal germanium layer; (c) forming an element isolation film by etching portions of the silicon layer, germanium layer and silicon substrate; (d) sequentially forming a gate insulation film and a gate conductive film on an entire structure and then patterning the films to form a gate electrode; and (e) forming junctions on both sides of the gate electrode.

At this time, the method of the present invention may further comprise the step of removing a portion of the silicon layer through at least one cleaning process after step (c).

Here, the cleaning process preferably comprises a first cleaning process of soaking the silicon substrate in a solution of $H_2SO_4+H_2O_2$, which has been heated at a temperature of 70 to 120° C., for 5 to 15 minutes; and a second cleaning process using a DHF solution.

Preferably, the gate insulation film and gate conductive film are deposited at a temperature of 300 to 700° C.

More preferably, step (e) comprises the steps of implanting predetermined dopants into both sides of the gate electrode through a predetermined ion implantation process such that the surface of the silicon layer is amorphized; and recrystallizing the amorphized layer and activating the dopants by executing a low-temperature solid growth process at a temperature of 350 to 650° C.

BRIEF DESCRIPTION OF THE DRAWINGS

The above and other objects, features and advantages of the present invention will become apparent from the following description of preferred embodiments given in conjunction with the accompanying drawings, in which.

DETAILED DESCRIPTION OF THE INVENTION

Figure 1A:
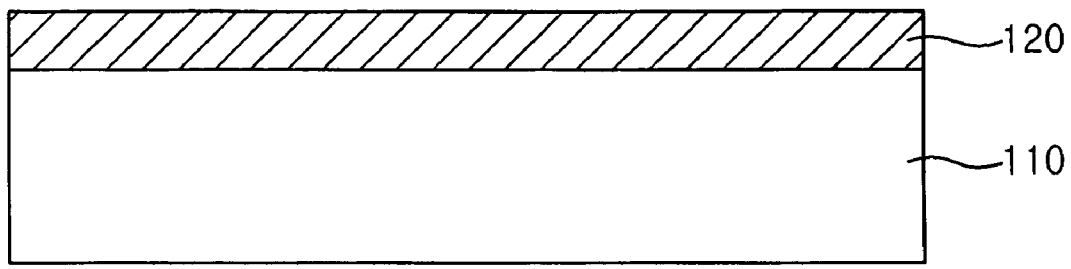
FIGS. 1a to 1h are sectional views illustrating a method of manufacturing a semiconductor device according to the present invention.

Hereinafter, a preferred embodiment of the present invention will be described more in detail with reference to the accompanying drawings. However, the present invention is not limited to the preferred embodiment thereof set forth herein but can be implemented in different forms. Rather, the preferred embodiment is merely provided to allow the present invention to be completely described herein and to fully convey the scope of the invention to those skilled in the art. In the drawings, like elements are designated by the same reference numerals.

In the present invention, a single crystal germanium layer is formed on a top surface of a silicon substrate and used as a channel to improve a carrier moving in a channel region of a semiconductor device. Further, a thin silicon layer is formed on the single crystal germanium layer to improve the reliability of a gate insulation film and the junction characteristics of a source and drain.

FIGS. 1a to 1h are sectional views illustrating a method of manufacturing a semiconductor device according to the present invention.

Referring to FIG. 1a, a single crystal germanium layer 120, which will be used as a channel region, is formed on a top surface of a silicon substrate 100. At this time, it is preferred that the thickness of the single crystal germanium layer 120 be less than a critical thickness corresponding to a thickness where crystal defects start to occur. Further, it is preferred that the silicon substrate 110 be made of single crystal silicon. Thus, the critical thickness of a germanium layer formed on the silicon substrate may vary according to a growth process but formed within a range of 0 to about 10 nm in this embodiment of the present invention. Preferably, the critical thickness is formed within a range of 0.10 to 15 nm. More preferably, the critical thickness is formed within a range of 5 to 10 nm. The reason that the single crystal germanium layer 120 is grown within the aforementioned thickness range is that the single crystal germanium layer 120 can be used as a channel region of a semiconductor device, i.e. a transistor, and crystal defects can be prevented. Since each of silicon and germanium is a Group IV element in a periodic table, it is covalently bonded. Further, the single crystal germanium can be easily grown on the single crystal silicon. However, an irregular atomic arrangement can be induced due to the difference in atomic sizes between underlying silicon and germanium and the factors generated when the silicon or germanium is subjected to continuous crystal growth. Such an irregular atomic arrangement can be represented as a point defect such as vacancy, a line defect such as dislocation and a surface defect such as stacking fault.

Figure 1B:
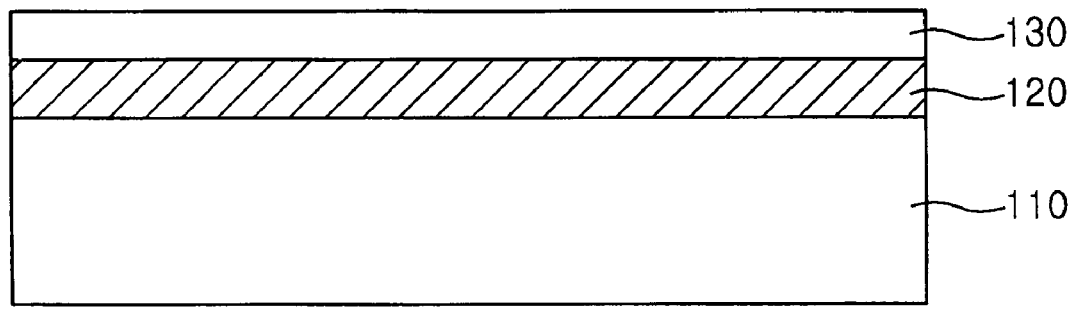

Referring to FIG. 1b, a silicon layer 130 is formed on the single crystal germanium layer 120. It is preferred that the silicon layer 130 is formed thinner than the single crystal germanium layer 120 such that a channel region is formed in the single crystal germanium layer 120. Preferably, the thickness of the silicon layer 130 is within a range of 1 to 7 nm. More preferably, the silicon layer 130 is formed to have a thickness of 3 to 5 nm. The silicon layer 130 is formed to have a thickness greater than a target thickness (1 to 2 nm) such that it can function as a protection layer for preventing the underlying single crystal germanium layer 120 from being damaged in the following process.

As a result, the silicon layer 130 having no crystal defects can be formed on the single crystal germanium layer 120. This is because the single crystal germanium layer 120 with a thickness less than the critical thickness has been formed to prevent crystal defects from occurring. Further, in the present embodiment, since a thin silicon film is formed on the single crystal germanium layer 120, a reliable gate insulation film can also be formed and a junction with a large band gap can be formed.

Figure 1C:
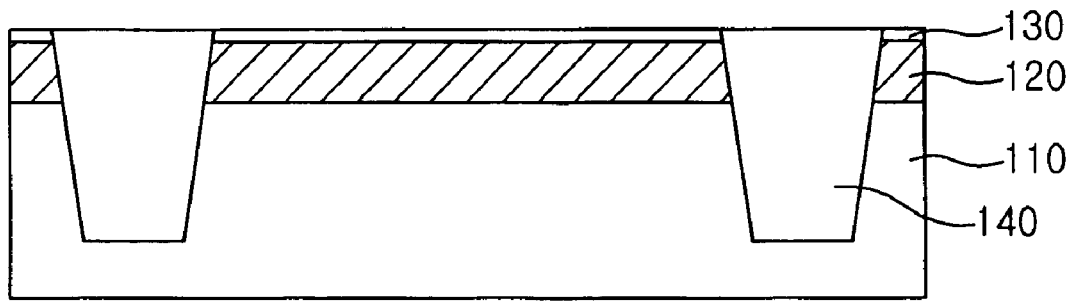

Referring to FIG. 1c, an element isolation film 140 for isolating elements from one another is formed, and the thickness of the silicon layer 130 is then adjusted.

First, portions of the silicon layer 130, the single crystal germanium layer 120 and the silicon substrate 110 are removed, and the removed portions are filled with oxide films to form the element isolation film 140. Of course, the element isolation film 140 may be formed through a variety of processes, but it is preferred in this embodiment of the present invention that the element isolation film 140 be formed through a shallow trench isolation (STI) process. That is, a photosensitive film pattern (not shown) is formed on the silicon layer 130 through a photoetching process using a photosensitive film and a mask for isolating elements. By executing an etching process in which the photosensitive film pattern is used as an etching mask, the silicon layer 130 and single crystal germanium layer 120 and a portion of the silicon substrate 110 are removed, and trenches for isolating elements are thus formed. An oxide film is deposited on a top surface of the entire structure, the photosensitive film pattern and oxide film formed on the silicon layer are removed such that the element isolation film 140 is formed. At this time, it is preferred that an HDP oxide film is used as an oxide film and the trenches are filled such that voids are not formed within the trenches.

Without being limited thereto, a variety of processes can be further added to improve the characteristics of the element isolating film 140. That is, a side wall of the trench may be inclined at a predetermined angle, and a sidewall oxidizing process may also be executed to compensate for the etching damage. Through the foregoing element isolating film 140, the silicon substrate 110 is separated into an active region and a field region, i.e. an element isolation region.

Thereafter, a portion of the silicon layer 130 is etched through a predetermined cleaning process such that the silicon layer 130 with a target thickness can be obtained.

That is, after a process of forming the element isolation film 140 has been executed, a cleaning process is performed. A first cleaning process is executed on the silicon substrate 110, the germanium layer 120 and the silicon layer 130 with the element isolation film 140 formed thereon using a solution of $H_2SO_4+H_2O_2$. At this time, a portion of the silicon layer 130 is oxidized, and a chemical oxide film is thus formed. The first cleaning process is executed by soaking the silicon substrate 110 in the solution of $H_2SO_4+H_2O_2$, which has been heated at a temperature of 70 to 120° C., for 5 to 15 minutes. Then, impurities are removed using deionized water (DI water), and a second cleaning process is then executed using a DHF solution, i.e. an HF solution diluted with $H_2O$ at the ratio of 50:1 to 100:1. The chemical oxide film is removed through the second cleaning process using the DHF solution. As a result, the silicon layer 130 is etched by a thickness of about 0.5 to 1.0 nm.

The first and the second cleaning processes are repeated several times to remove a portion of the silicon layer 130 formed on the single crystal germanium layer 120, so that the thickness of the silicon layer 130 can be reduced. It is preferred that the number of times repeated be 1 to 10. The reason is that if the silicon layer 130 is thick, the single crystal germanium layer 120 formed beneath the silicon layer cannot function as a channel region. Therefore, it is preferred that the foregoing cleaning processes be repeated such that the thickness of the silicon layer 130 can be within a range of 1 to 3 nm.

Figure 1D:
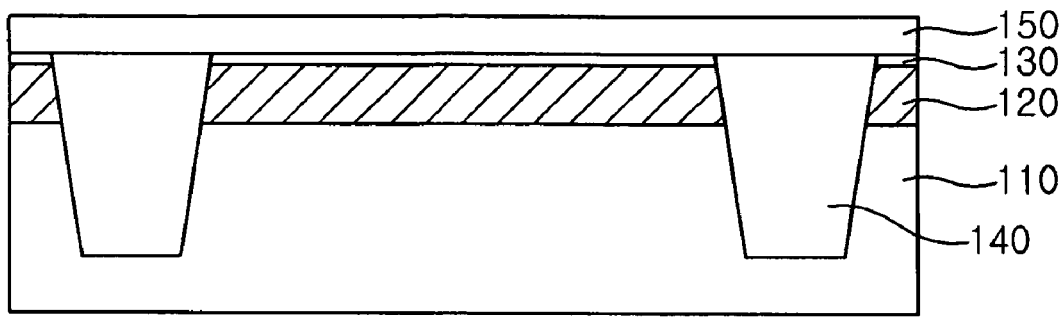

Referring to FIG. 1d, a gate insulation film 150 is formed on a top surface of the entire structure. At this time, it is preferable to execute a process of forming the gate insulation film 150 at a temperature where the out-diffusion of germanium particles within the underlying single crystal germanium layer 120 can be prevented. In this embodiment, an oxide film ($SiO_2$) is formed with the gate insulation film 150, particularly by performing an oxidizing process at a temperature of 300 to 700° C. Of course, the present invention is not limited thereto. That is, in a case where an insulation film with a high dielectric constant, such as $HfO_2$ or HfAlO, is used as the gate insulation film 150, an $HfO_2$ or HfAlO film is formed on the silicon layer 130 through an MOCVD or ALD method and then cooled. That is, to prevent the out-diffusion of germanium, a subsequent annealing process needs not be executed after the vapor deposition process.

Figure 1E:
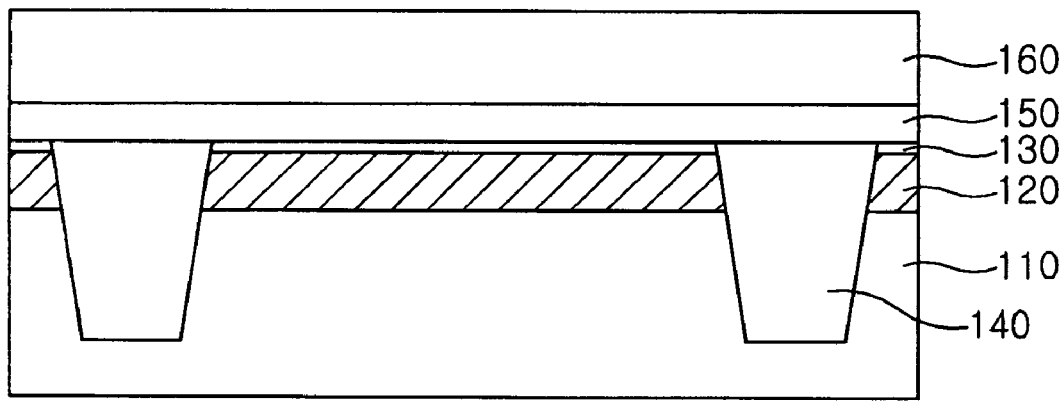

Referring to FIG. 1e, a gate conductive film 160 is formed on the gate insulation film 150. A polysilicon film, metal film or silicide film can be used as the gate conductive film 160. When performing the foregoing process of forming the gate conductive film 160, the maximum process temperature is preferably controlled below 700° C. As a result, the out-diffusion of germanium can be prevented.

Figure 1F:
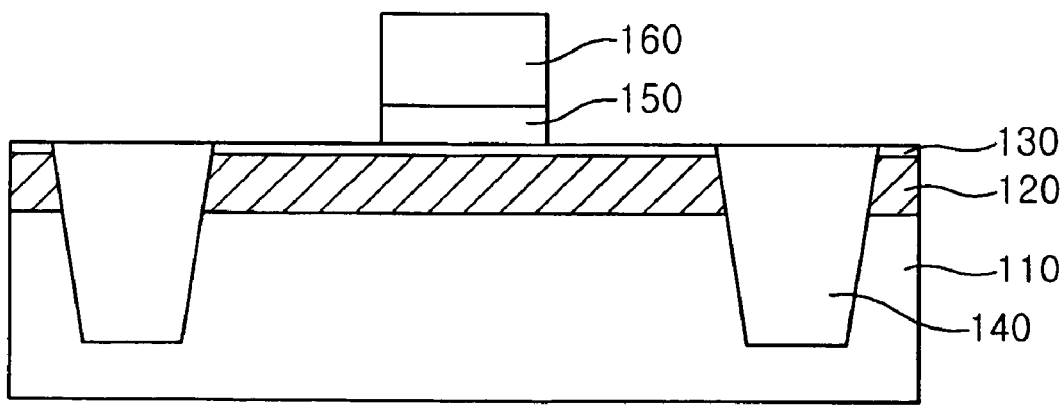

Referring to FIG. 1f, portions of the gate conductive film 160 and gate insulation film 150 are removed through a patterning process to form gate electrodes 150 and 160.

In the patterning process, a photosensitive film is coated onto the gate conductive film 160. That is, the photosensitive film (not shown) is formed through a photoetching process using a gate mask. Then, the exposed gate conductive film 160 and gate insulation film 150 are removed through an etching process using the photosensitive film as an etching mask, so that the gate electrodes 150 and 160 are formed. Thereafter, the photosensitive pattern is removed by performing a predetermined stripping process.

Figure 1G:
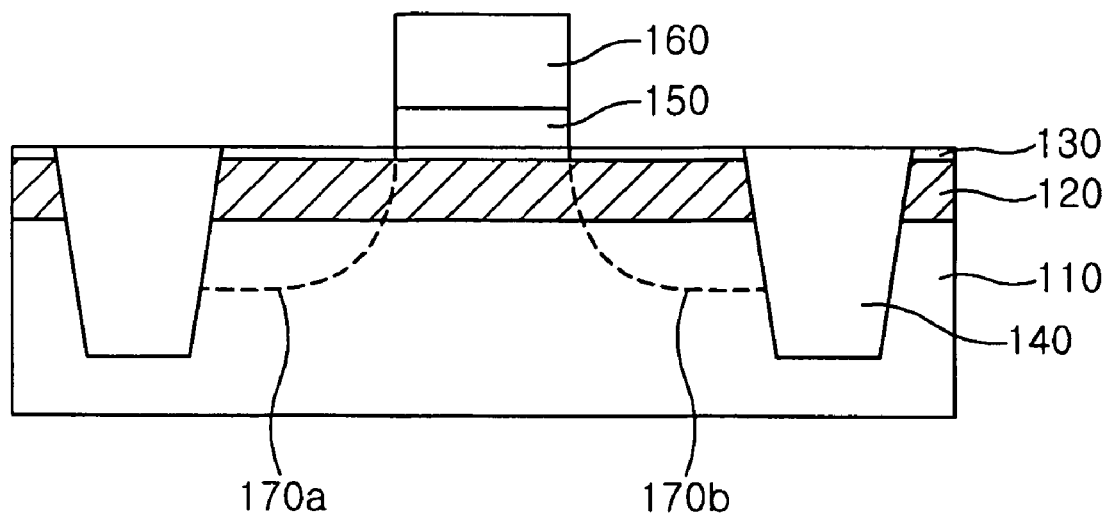

Referring to FIG. 1g, a predetermined ion implantation process is executed into the exposed silicon layer 130, the single crystal germanium layer 120 and the silicon substrate 110 on both sides of the gage electrode 150 and 160, so that junctions 170a and 170b are formed thereon. The junctions 170a and 170b correspond to the source and drain layers, respectively. At this time, it is preferred that ion energy be controlled such that regions where ions are implanted during the ion implantation process can be amorphized. Meanwhile, in a case where N-type and p-type MOSFETs are fabricated on a single substrate, it is effective that different impurities are implanted using separate ion implantation masks.

After the ion implanting process, a low-temperature solid growth process is executed such that the amorphized layers are recrystallized and implanted dapants are then activated. It is preferred that the low-temperature solid growth process is executed at a temperature of 350 to 650° C. After the low-temperature solid growth process, the RTA annealing is executed at a temperature of 700 to 800° C. for about 8 to 12 seconds.

Figure 1H:
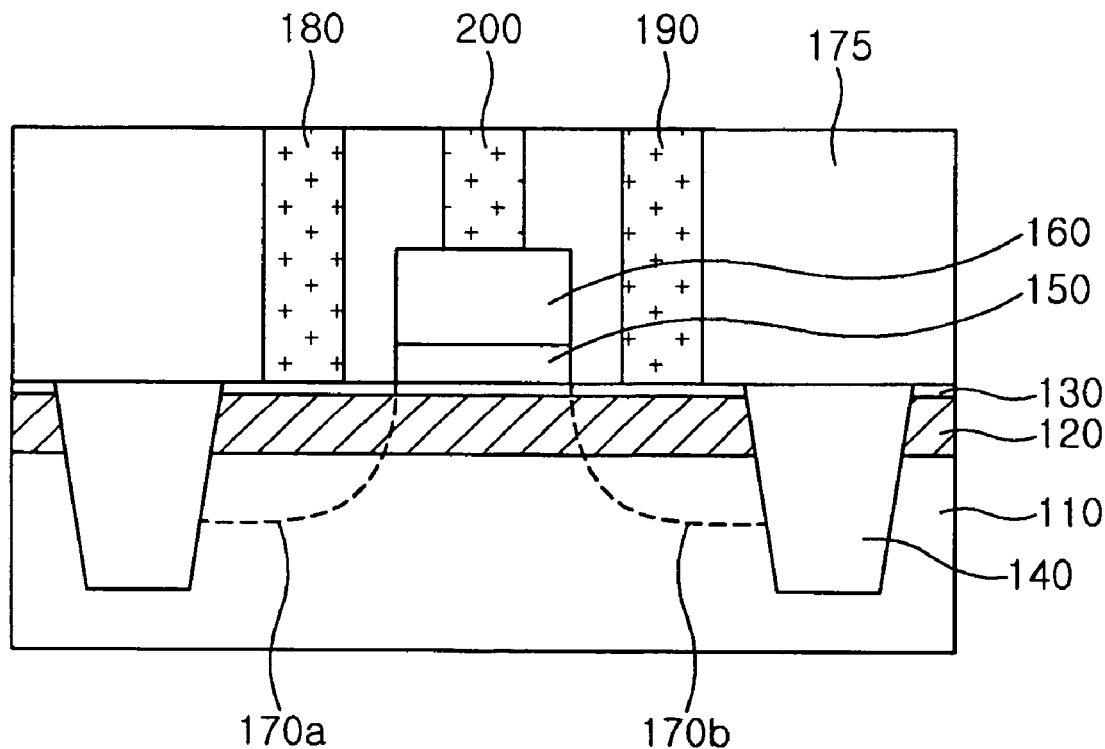

Referring to FIG. 1h, conductive plugs 180, 190 and 200 are formed on the gate electrodes 150 and 160, the source 170a and the drain 170b, respectively. To this end, an interlayer insulation film 175 is first formed on the entire structure, and holes for exposing the underlying gate electrodes 150 and 160, and junctions 170a and 170b are then formed. The holes are filled with conductive materials and then planarized to form a plurality of the conductive plugs 180, 190 and 200. That is, a conductive plug 190 for source, a conductive plug 190 for bit line and a conductive plug 200 for word line are formed on the source 170a, the drain 170b and gate electrodes 150 and 160, respectively. Then, a source line (not shown) connected with the conductive plug 180 for source, a bit line (not shown) connected with the conductive plug 190 for bit line and a word line (not shown) connected with the conductive plug 200 for word line are formed through execution of a metallization process.

The present invention is not limited to the foregoing process but can vary according to the characteristics of a semiconductor device. That is, the present invention can be applied to a memory device such as DRAM and flash in addition to a CMOS device.

The semiconductor device according to the present invention includes a single crystal germanium layer and silicon layer sequentially formed on a semiconductor substrate, a gate electrode formed on the silicon layer, and a junction layer formed on both sides of the gate electrode.

The thickness of the single crystal germanium layer is adjusted such that crystal defects are not generated between the single crystal germanium layer and an underlying semiconductor substrate, and the thickness of the single crystal germanium and silicon layer is simultaneously adjusted such that a channel region can be formed within the single crystal germanium layer. That is, it is preferable to adjust the thickness of the single crystal germanium layer such that 80 to 100% of the channel region is formed within the single crystal germanium layer. Accordingly, it is preferred that the single crystal germanium is formed to a thickness of 0.01 to 15 nm. Further, it is preferred that the silicon layer is formed to a thickness of 1 to 3 nm.

The reason is that the channel region is generally formed within a depth of about 5 nm from an interface between the gate insulation film and semiconductor substrate, and carriers are concentrated in a depth of about 2 nm from the interface. In the present invention, therefore, a single crystal germanium layer is formed to the aforementioned thickness such that the carrier mobility in the channel can be equal to that of a device using a germanium wafer. Further, since a silicon layer is deposited on a single crystal germanium layer, a lattice lateral compressive stress is applied to the single crystal germanium layer due to lattice mismatch. Accordingly, an effect that a channel is formed in a strained germanium layer can be obtained. Further, since a tensile stress is also applied to a silicon layer formed on the single crystal germanium layer, inversion carriers can have mobility as high as the strained silicon layer.

Figure 2:
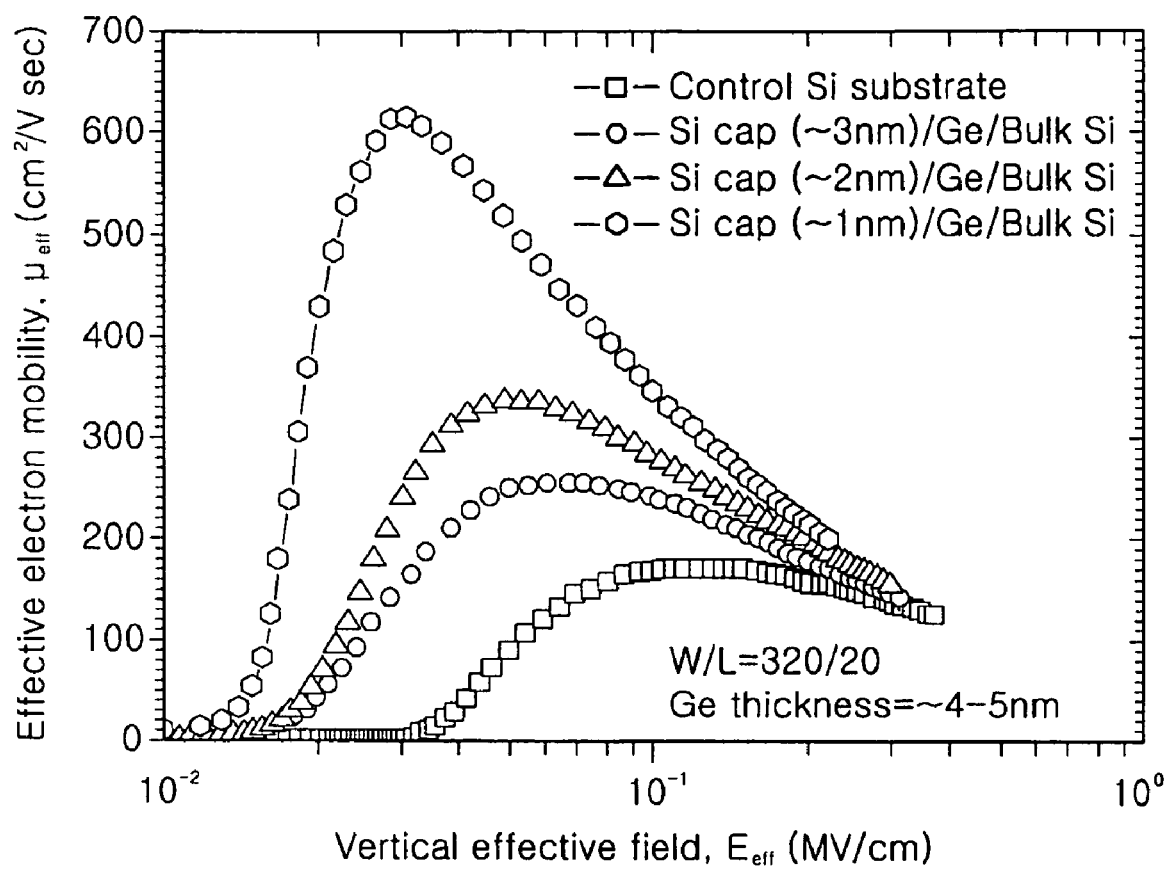
FIG. 2 is a graph plotting measurement results of carrier mobility depending on a thickness of a silicon layer.

FIG. 2 is a graph plotting measurement results of carrier mobility depending on a thickness of a silicon layer.

FIG. 2 shows the graph plotting the measurement results of carrier mobility when the thickness of a silicon layer formed on a single crystal germanium layer is controlled to 1 nm, 2 nm, 3 nm or the like. In a case where the thickness of the silicon layer is 1 nm, almost all the inversion carriers are formed on the strained germanium layer, and thus, a peak value of electron mobility is increased at least 3 times. That is, such an increase in the electron mobility means an increase in a drain current, which in turn leads to an improvement of an operating speed of devices. In the above experiments, a hafnium aluminum oxide film has been used as a gate insulation film.

Furthermore, since the surface of a device is still made of silicon, the instability problem of a gate insulation film can be solved. In addition, since a source and drain is also bonded on the silicon layer, a leakage current problem can also be solved. Moreover, the same effect can be obtained without using an expensive germanium wafer.

According to the present invention as described above, there is an advantage in that carrier mobility of channels can be enhanced since the channels of semiconductor devices are placed within a germanium layer.

Further, since a silicon layer is formed on the germanium layer, a reliable gate insulation film can be formed and a leakage current produced in a junction layer can also be reduced.

Moreover, the same effect can be obtained without using an expensive germanium wafer. Therefore, since conventional processes and equipment can be used as they are, highly efficient semiconductor devices can be fabricated without increase of a unit cost of production.

Although the present invention has been described in detail in connection with the aforementioned specific embodiment, it will be readily understood by those skilled in the art that various modifications and changes can be made thereto within the technical spirit and scope of the present invention. It is apparent that the modifications and changes fall within the scope of the present invention defined by the appended claims.

What is claimed is:

1. A semiconductor substrate, comprising:
   a silicon substrate;
   a single crystal germanium layer formed on the silicon substrate, the single crystal germanium layer being in contact with a surface of the silicon substrate that consists essentially of silicon; and
   a silicon layer formed on the single crystal gennanium layer,
   wherein the silicon layer is formed to a thickness of 1 to 3 nm.

2. A semiconductor device, comprising:
   a silicon substrate;
   a single crystal germanium layer formed on the silicon substrate;
   a silicon layer formed on the single crystal germanium layer;
   an element isolation film within the silicon layer, the germanium layer and the silicon substrate, wherein a bottom surface of the element isolation film contacts the silicon substrate;
   a gate insulation film formed on the silicon layer;
   a gate electrode formed on the gate insulation film; and
   junctions formed across portions of the silicon layer, the single crystal germanium layer and the silicon substrate at both sides of the gate electrode.

3. The semiconductor device as claimed in claim 2, further comprising an element isolation film formed on the substrate.

4. A method of manufacturing a semiconductor device comprising:
   forming a single crystal germanium layer on a silicon substrate;
   forming a silicon layer on the single crystal germanium layer;
   forming a trench by etching a portion of the silicon layer, the single crystal germanium layer and the silicon substrate, a bottom of the trench consisting essentially or silicon;
   forming an element isolation film by filling the trench with oxide film;
   sequentially forming a gate insulation film and a gate conductive film on an entire structure and then patterning the gate insulation and gate conductive films to form a gate electrode; and
   forming junctions across portions of the silicon layer, the single crystal germanium layer and the silicon substrate at both sides of the gate electrode.

5. The method as claimed in claim 4, further comprising, after forming the element isolation film, removing a portion of the silicon layer through at least one cleaning process.

6. The method as claimed in claim 5, wherein the at least one cleaning process comprises:
   a first cleaning process of soaking the silicon substrate in a solution of $H_2SO_4 + H_2O_2$ which has been heated at a temperature of 70 to 120° C., for 5 to 15 minutes; and
   a second cleaning process using a DHF solution.

7. The method as claimed in claim 4, wherein the gate insulation film and gate conductive film are deposited at a temperature of 300 to 700° C.

8. The method as claimed in claim 4, wherein forming junctions comprises:
   implanting predetermined dopants into both sides of the gate electrode through a predetermined ion implantation process such that the surface of the silicon layer is amorphized; and
   recrystallizing the amorphized layer and activating the dopants by executing a low-temperature solid growth process at a temperature of 350 to 650° C.

9. The semiconductor substrate as claimed in claim 1, wherein the single crystal germanium layer is formed to such a thickness that a lattice defect is not generated between the single crystal germanium layer and the silicon substrate.

10. The semiconductor substrate as claimed in claim 9, wherein the single crystal germanium layer is formed to a thickness of 0.01 to 15 nm.

* * * * *